(12) United States Patent
Shum

(10) Patent No.: US 8,076,831 B2
(45) Date of Patent: *Dec. 13, 2011

(54) OPTICAL PLATFORM TO ENABLE EFFICIENT LED EMISSION

(75) Inventor: Frank Shum, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/938,003

(22) Filed: Nov. 2, 2010

(65) Prior Publication Data

US 2011/0103071 A1    May 5, 2011

Related U.S. Application Data

(63) Continuation of application No. 12/201,936, filed on Aug. 29, 2008, now Pat. No. 7,839,062.

(51) Int. Cl.
*H01J 5/16* (2006.01)

(52) U.S. Cl. .................. 313/110; 257/E33.073
(58) Field of Classification Search ............. 362/311.02; 313/110–112, 512; 257/98, E33.073, E33.074; 438/31, 32
See application file for complete search history.

(56) References Cited

U.S. PATENT DOCUMENTS

| | | | |
|---|---|---|---|
| 7,549,769 B2 * | 6/2009 | Kim et al. | 362/241 |
| 7,839,062 B2 * | 11/2010 | Shum | 313/110 |
| 2007/0145397 A1 * | 6/2007 | DenBaars et al. | 257/98 |
| 2008/0067531 A1 * | 3/2008 | Chang | 257/98 |

* cited by examiner

*Primary Examiner* — John A Ward
(74) *Attorney, Agent, or Firm* — Arent Fox LLP

(57) ABSTRACT

An integrated multi-layer apparatus and method of producing the same is disclosed. The apparatus comprises an LED, a beam shaping layer, and a refracting layer between the beam shaping layer from the LED. The refracting layer may have an index of refraction lower than the index of refraction of the LED and the beam shaping layer.

8 Claims, 2 Drawing Sheets

OPTICAL PLATFORM TO ENABLE EFFICIENT LED EMISSION

CROSS-REFERENCE TO RELATED APPLICATION

This application is a continuation of U.S. patent application Ser. No. 12/201,936, filed Aug. 29, 2008 now U.S. Pat. No. 7,839,062, the contents of which are hereby incorporated by reference herein in their entirety.

FIELD

The present disclosure relates generally to the field of semiconductor light emitting devices, and more specifically, to recycling optics for light emitting diodes.

BACKGROUND

A light emitting diode (LED) is a semiconductor material impregnated, or doped, with impurities. These impurities add "electrons" and "holes" to the semiconductor, which can move in the material relatively freely. Depending on the kind of impurity, a doped region of the semiconductor can have predominantly electrons or holes, and is referred as n-type or p-type semiconductor regions, respectively. In LED applications, the semiconductor includes an n-type region and a p-type region. A reverse electric field is created at the junction between the two regions, which cause the electrons and holes to move away from the junction to form an "active region." When a forward voltage sufficient to overcome the reverse electric field is applied across the p-n junction, electrons and holes are forced into the active region and combine. When an electron combines with a hole, it falls to a lower energy level and releases energy in the form of light.

The light emission profile from an LED is non-directional and typically assumes a "lambertian" like profile where light is equally emitted into all directions. However, in many applications, only focused light is useful. Typically, secondary optics are required to capture and shape a larger portion of the total available light from the LED. These secondary optics are costly and increase the size of the overall package carrying the LED.

Accordingly, it would be desirable to shape the emission profile from an LED such that the emitted light can more readily be used without external complicated and costly secondary optics.

SUMMARY

In one aspect of the disclosure, an integrated multi-layer apparatus includes an LED configured to emit light having a first portion emitted within an angular range and a second portion emitted outside the angular range; a beam shaping layer configured to pass the first portion of the emitted light and reflect the second portion of the emitted light back to the LED; a refracting layer between the beam shaping layer and the LED, the refracting layer having an index of refraction lower than the index of refraction of the LED and the beam shaping layer; wherein the LED is further configured to randomly scatter the second portion of the emitted light reflected by the beam shaping layer and redirect the scattered light back to the beam shaping layer.

In another aspect of the disclosure, an integrated multi-layer apparatus includes an LED configured to emit light having a first portion emitted within an angular range and a second portion emitted outside the angular range; a beam shaping layer configured to pass the first portion of the emitted light and reflect the second portion of the emitted light back to the LED; a refracting layer between the beam shaping layer and the LED, the refracting layer having an index of refraction lower than the index of refraction of the LED and the beam shaping layer; wherein the LED further comprises a roughened surface in communication with the refracting layer and a back reflector.

In yet another aspect of the disclosure, an integrated multi-layer apparatus includes light emitting means for emitting light, wherein the light includes a first portion emitted within an angular range and a second portion emitted outside the angular range; beam shaping means for passing the first portion of the emitted light and reflecting the second portion of the emitted light back to the light emitting means; refracting means for refracting the emitted light, the refracting means having an index of refraction lower than the index of refraction of the light emitting means and the beam shaping means; wherein the light emitting means comprises means for randomly scattering the second portion of the emitted light reflected by the beam shaping means and means for redirecting the scattered light back to the beam shaping means.

In a further aspect of the disclosure, a method of emitting light from an integrated multi-layer structure is described. The integrated multi-layer structure includes an LED, a beam shaping layer, and a refracting layer between the LED and the beam shaping layer, wherein the refracting layer comprises an index of refraction lower than the index of refraction of the LED and the beam shaping layer. The method includes emitting light from the LED, wherein the light includes a first portion emitted within an angular range and a second portion emitted outside the angular range; passing the first portion of the emitted light through the beam shaping layer and reflecting the second portion of the emitted light from the beam shaping layer back to the LED; randomly scattering, at the LED, the second portion of the emitted light reflected by the beam shaping layer; and redirecting the scattered light from the LED back to the beam shaping layer.

It is understood that other aspects of the present disclosure will become readily apparent to those skilled in the art from the following detailed description, wherein it is shown and described only exemplary aspects of the disclosure by way of illustration. As will be realized, the disclosure includes other and different aspects and its several details are capable of modification in various other respects, all without departing from the spirit and scope of the present disclosure. Accordingly, the drawings and the detailed description are to be regarded as illustrative in nature and not as restrictive.

BRIEF DESCRIPTION OF THE DRAWINGS

Various aspects of the present disclosure are illustrated by way of example, and not by way of limitation, in the accompanying drawings, wherein.

DETAILED DESCRIPTION

Figure 1:
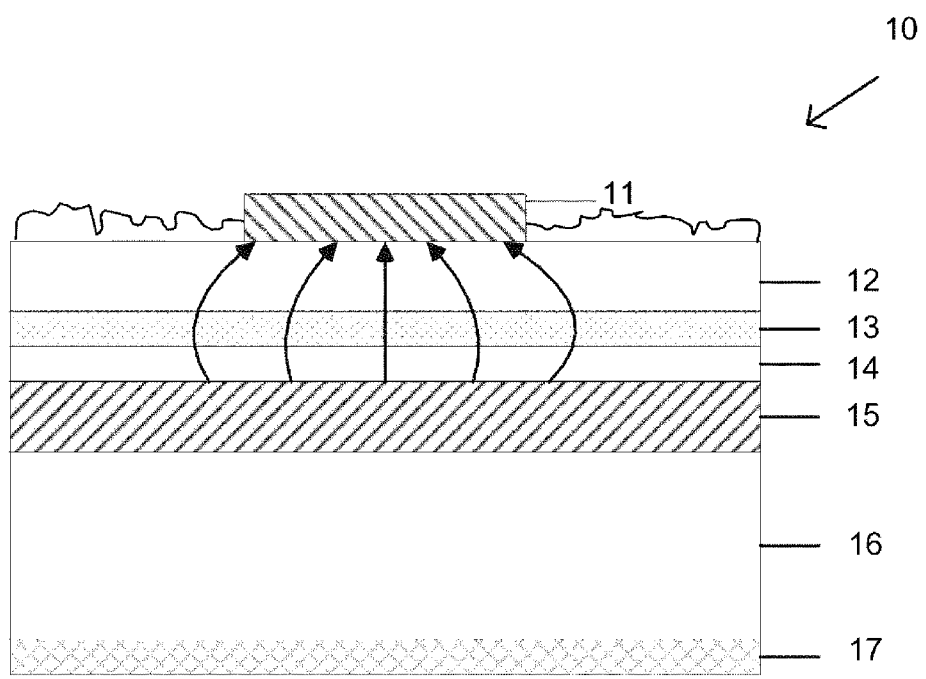
FIG. 1 is a cross-section view illustrating an example of an LED.

The detailed description set forth below in connection with the appended drawings is intended as a description of various aspects of the present disclosure and is not intended to represent all ways in which the present disclosure may be practiced. The detailed description may include specific details for the purpose of providing a thorough understanding of the present disclosure; however, it will be apparent to those skilled in the art that the various aspects of the present disclosure may be practiced without these specific details. In some instances, well-known structures and components are summarily described and/or shown in block diagram form in order to avoid obscuring the concepts of the present disclosure.

In several configurations of an apparatus, the emission profile is shaped such that the emitted light can more readily be used without external complicated and costly external secondary optics. Furthermore because no secondary optical devices are used, as described below, the resulting size of the overall package is small. The brightness of emitted light may be improved due to the methods of light recycling employed. Various aspects of the disclosure are based on geometrical optics and thus unlike diffractive or photonic crystal structures, are much less sensitive to polarization and wavelength and can be tailored for various applications.

Various aspects of this disclosure will be described in terms of an integrated multi-layer apparatus. As used herein, an integrated multi-layer apparatus is intended to cover a structure having multiple layers. Each layer of the apparatus may itself comprise several layers or sub-layers. By way of example, an integrated multi-layer apparatus may include an LED layer having an active region sandwiched between two oppositely doped epitaxial layers all of which are formed on a growth substrate. A beam shaping layer formed on the LED may include several layers of material deposited onto a substrate such as glass. In other words, the term "layer" used throughout this disclose does not necessarily denote a homogeneous layer of material.

As those skilled in the art will readily appreciate, when a layer is referred to as being "on" another layer, it can be directly on the other layer or intervening layers may be present. For instance, the preceding reference to a beam shaping layer on an LED does not preclude intervening layers between the two. In a configuration of a multi-layer apparatus discussed below, a refracting layer is formed between the LED and the beam shaping layer.

The "integration" of these layers into the apparatus means that the layers are formed together by suitable means, now known or later discovered. By way of example, the LED may be grown on a substrate and the beam shaping layer may be adhered, bonded or otherwise applied to the LED, either directly or through an intervening layer (e.g., refracting layer).

Various aspects of an integrated multi-layer apparatus are described herein with reference to cross-sectional view illustrations that are conceptual in nature. Various layers of the apparatus should not be construed as limited to the particular configuration shown in the drawings. By way of example, the "layers" of an integrated multi-layer apparatus are shown with discrete physical boundaries. However, in practice, a concentration gradient may exist across the physical boundaries between layers with the material from one layer penetrating the material of adjacent layers in either a controlled or random fashion. Thus, the layers illustrated in the drawings are conceptual in nature and their shapes are not intended to illustrate the precise shape of a layer and are not intended to limit the scope of the invention.

Those skilled in the art will further appreciate that relative terms such as "top" or "bottom" (and similar terms) may be used herein to describe a relationship between layers. Notwithstanding the use of such terms, those skilled in the art will readily understand that the concepts presented throughout this disclosure are intended to extend to different orientations of an integrated multi-layer apparatus in addition to the orientation depicted in the drawings.

Turning to FIG. 1, an LED with a vertical structure is shown. However, as those skilled in the art will readily appreciate, the various aspects presented throughout this disclosure are likewise applicable to other LED configurations, as well as other light emitting semiconductors, now known or later discovered. Accordingly, any reference to a vertical structure LED is intended only to illustrate various aspects of an integrated multilayer apparatus, with the understanding that such aspects have a wide range of applications.

FIG. 1 is a cross-section view illustrating an example of an LED. In this example, the LED 10 has a vertical current injection configuration, including an n-type contact (or n-type electrode) 11, an n-type semiconductor layer 12, an active region 13, a p-type semiconductor layer 14, a p-type contact (or p-type electrode) 15, a thermally and/or electrically conductive substrate 16 to support the LED structurally, and a back reflector 17. The LED may be fabricated using known processes with a suitable process being a fabrication process using chemical vapor deposition. The LED may be formed on a wafer and then singulated for mounting in a package. The growth substrate may remain as part of the singulated LED or the growth substrate may be fully or partially removed.

As the n-type semiconductor layer 12 and the p-type semiconductor layer 104 are opposite to each other, together they form a pair of carrier injectors relative to the active region 13. Therefore, when a voltage is applied to the LED 10, electrons and holes will be combined in the active region 13, thereby releasing energy in the form of light. If an incident angle of light at the interface between the n-type semiconductor layer 12 and the ambient air (or other encapsulating material) is greater than a critical angle in accordance with Snell's law, a portion of light generated inside the LED 10 device may get trapped inside the LED 10 due to total-internal-reflection (TIR). To increase the chance of light escaping from the LED, the n-type semiconductor layer 12 is roughened. Alternatively, or in addition to, the bottom of the p-type semiconductor layer 16 may be roughened (not shown). The roughened surface scatters the normal incident light in random directions and reduces the effects of TIR. The back reflector 17 may be provided at the bottom of the LED 10 for redirecting light emitted from the active region 13 back toward the top surface of the LED 10. Alternatively, or in addition to, one or more the sides of the LED 10 may also have a back reflector.

Figure 2:
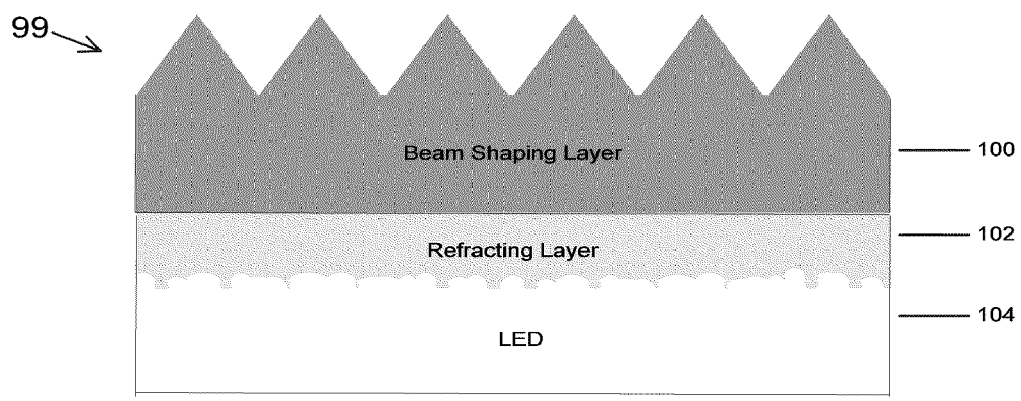
FIG. 2 is a cross-section view illustrating an example of an integrated multi-layer apparatus.

In one configuration, as shown in FIG. 2, an integrated multi-layer apparatus 99 includes a beam shaping layer 100; a refracting layer 102; and an LED 104. The LED 104 emits light through the refracting layer 102 to the beam shaping layer 100. The beam shaping layer 100 may be an optical element or filter that passes an angular range of incident light and reflects light falling outside the angular range due to TIR. The optical element may be formed by depositing several layers of material onto a substrate (e.g., glass) by a physical vapor deposition process such as evaporative or sputter deposition or a chemical process such as chemical vapor deposition. An example of an optical element is a periodic prism structure manufactured by 3M under the trademark Vikuiti™ Brightness Enhancement Film (BEF). Other optical elements that may be used include periodic structures formed with a number of lenses, mirrors, prisms, or other optical components, or any combination thereof. In this example, the light falling outside the angular range is reflected by the beam shaping layer 100 back to the LED 104. The reflected light is then randomly scattered by the roughened surface of the LED and redirected back to the beam shaping layer 100 by the back reflector (see FIG. 1).

The refracting layer 102 is a layer which has an index of refraction which is less than the index of refraction of the beam shaping layer 100 and the LED 104. The refracting layer 102 may be a material such as air or some other suitable material. In the case of air, the multilayer apparatus 99 may be physically constructed to provide an air gap between the LED 104 and the beam shaping layer 100 by means well known in the art. In this configuration, the refracting layer 102 separates the beam shaping layer 100 from the LED by at least 1 $\lambda/nL$ to ensure no direct coupling between the two takes place, where $\lambda$ is the wavelength, and nL is the index of refraction of the refracting layer 102.

In the integrated multi-layer apparatus 99 of FIG. 2, light generated by the LED 104 gets refracted as it travels through the low-index region of the refracting layer 102 to the high-index region of the beam shaping layer 100, thereby causing high angle light propagating through the refracting layer 102 to bend to a lower angle within the beam shaping layer 100. This enables narrower angle light to be incident onto the beam shaping layer 100, thereby reducing the amount of light that is reflected back to the LED 104. As a result, the emission profile should be narrower than without the refracting layer.

In a configuration, it is possible to employ a one-dimensional structure in the beam shaping layer 100. This would be useful in applications such as side view lighting for LCD display. In other applications, such as direct view backlight for liquid crystal display (LCD) TVs, most of the light is kept at a high angle. Yet, in other applications, the divergence is narrowed in one direction and is increased in orthogonal directions. All these different types of emissions can be obtained through the beam shaping layer 100 of the configuration shown in FIG. 2.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method of emitting light from an integrated multi-layer structure having a LED, a beam shaping layer, and a refracting layer between the LED and the beam shaping layer, wherein the refracting layer comprises an index of refraction lower than the index of refraction of the LED and the beam shaping layer, the method comprising:
    emitting light from the LED, wherein the light includes a first portion emitted within an angular range and a second portion emitted outside the angular range;
    passing the first portion of the emitted light through the beam shaping layer and reflecting the second portion of the emitted light from the beam shaping layer back to the LED;
    randomly scattering, at the LED, the second portion of the emitted light reflected by the beam shaping layer; and
    redirecting the scattered light from the LED back to the beam shaping layer.

2. The method of claim 1 wherein the beam shaping layer comprises periodic optical structures.

3. The method of claim 1 wherein the beam shaping layer comprises at least one of a lens, mirror, or prism.

4. The method of claim 1 wherein the beam shaping layer and the LED are arranged to avoid any direct couplings between the two.

5. The method of claim 1 wherein the refracting layer separates the beam shaping layer from the LED by at least 1 $\lambda/nL$.

6. The method of claim 1 wherein the refracting layer comprises air.

7. The method of claim 1 wherein the LED comprises a roughened surface, and wherein the second portion of the emitted light is randomly scattered by the roughened surface of the LED.

8. The method of claim 1, wherein the LED comprises a back reflector, and wherein the scattered light is redirected back to the beam shaping layer by the back reflector.

* * * * *